(12) United States Patent
Smits

(10) Patent No.: US 11,599,028 B2
(45) Date of Patent: Mar. 7, 2023

(54) METHODS AND SYSTEMS FOR CLAMPING A SUBSTRATE

(71) Applicant: ASML Netherlands B.V., Veldhoven (NL)

(72) Inventor: Marc Smits, Delf (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/812,175

(22) Filed: Mar. 6, 2020

(65) Prior Publication Data

US 2020/0209763 A1 Jul. 2, 2020

Related U.S. Application Data

(63) Continuation of application No. PCT/JP2018/029695, filed on Jul. 31, 2018.

(60) Provisional application No. 62/555,087, filed on Sep. 7, 2017.

(51) Int. Cl.
*G03F 7/20* (2006.01)

(52) U.S. Cl.
CPC ............... *G03F 7/70716* (2013.01)

(58) Field of Classification Search
CPC ........ G03F 7/20; G03F 7/70716; G03F 7/707; B29C 66/00141
USPC ...................................... 355/72–76
See application file for complete search history.

(56) References Cited

U.S. PATENT DOCUMENTS

| | | | |
|---|---|---|---|
| 5,447,596 | A | 9/1995 | Hayase |
| 7,541,264 | B2 | 6/2009 | Gardner et al. |
| 8,436,324 | B2 | 5/2013 | De Jong |
| 8,514,370 | B2 | 8/2013 | De Jong |

(Continued)

FOREIGN PATENT DOCUMENTS

| | | |
|---|---|---|
| EP | 2 717 307 A1 | 4/2014 |
| EP | 2 752 871 A1 | 7/2014 |

(Continued)

OTHER PUBLICATIONS

International Search Report and Written Opinion issued in related International PCT Application No. PCT/JP2018/029695, dated Oct. 9, 2018 (2 pgs.).

*Primary Examiner* — Hung V Nguyen
(74) *Attorney, Agent, or Firm* — Finnegan, Henderson, Farabow, Garrett & Dunner, LLP

(57) ABSTRACT

Methods and arrangement for clamping substrates to a support using adhesive material area disclosed.
The method comprises providing a support comprising a first surface defining a plane; applying adhesive material on at least portions of the first surface; and placing the substrate onto the adhesive material, wherein the adhesive material forms a plurality of support locations supporting the substrate. Preferably the adhesive material is cured at least partly during the application of a substantially uniformly distributed force to the substrate in the direction of the support.
The arrangements comprise a support comprising a first surface, for supporting the substrate via adhesive material, whereby the first surface defines a plane. Preferably it also comprises an arrangement for providing electromagnetic radiation, thermal energy, and/or a chemical substance to the (Continued)

adhesive material, and an arrangement for providing a substantially uniformly distributed force to the substrate in the direction of the support.

20 Claims, 6 Drawing Sheets

(56) References Cited

U.S. PATENT DOCUMENTS

| | | | |
|---|---|---|---|
| 8,705,010 B2 | 4/2014 | De Boer et al. | |
| 8,991,330 B2 | 3/2015 | De Jong | |
| 9,460,954 B2 | 10/2016 | De Jong et al. | |
| 2004/0011457 A1* | 1/2004 | Kobayashi | B29C 66/00141 156/272.2 |
| 2004/0192012 A1 | 9/2004 | Takezoe et al. | |
| 2004/0231793 A1 | 11/2004 | Kroninger et al. | |
| 2004/0248420 A1 | 12/2004 | Yun et al. | |
| 2010/0236476 A1* | 9/2010 | De Jong | H01L 21/6875 118/620 |
| 2012/0247664 A1* | 10/2012 | Kobayashi | H01L 24/75 156/285 |
| 2013/0157439 A1 | 6/2013 | Blackshear | |
| 2014/0106137 A1 | 4/2014 | Kondo et al. | |
| 2015/0251396 A1 | 9/2015 | Gregory et al. | |

FOREIGN PATENT DOCUMENTS

| | | | | |
|---|---|---|---|---|
| JP | 2005 072496 A | | 3/2005 | |
| JP | 2005 277117 A | | 10/2005 | |
| JP | 2009 016430 A | | 1/2009 | |
| JP | 2010249722 A | * | 11/2010 | ............ G01T 1/20 |
| JP | 2013 055093 A | | 3/2013 | |
| JP | 2016 039185 A | | 3/2016 | |
| WO | WO 2013/142054 A1 | | 9/2013 | |

* cited by examiner

METHODS AND SYSTEMS FOR CLAMPING A SUBSTRATE

CROSS-REFERENCE TO RELATED APPLICATIONS

This application claims priority to International Application No. PCT/JP2018/029695, filed Jul. 31, 2018, and published as WO 2019/049588 A1, which claims priority of U.S. Provisional Application No. 62/555,087 which was filed on Sep. 7, 2017. The contents of these applications are incorporated herein by reference in their entireties.

TECHNICAL FIELD

The disclosed embodiments relate to methods and systems for clamping a substrate to a support.

BACKGROUND

In semiconductor lithography small structures are formed with high accuracy and reliability. In charged particle multiple beam lithography charged particles are directed onto the surface of a target, typically a wafer, to form patterns forming the basis of integrated circuits and components thereof. Such patterns usually comprise details within the nanometer range. In multiple beam lithography the pattern formed on the surface is determined by the position where each beam interacts with the resist on the surface. Lithography generally involves exposures of multiple subsequent layers, so that features formed in subsequent layers may be connected to create integrated circuits. Therefore, not only a pattern within one layer has to meet the required accuracy, but a pattern exposed in a subsequent exposure session has to be aligned with the one or more patterns created in previous exposure sessions in a sufficiently accurate manner.

This requires a highly accurate and stable positioning of the substrate during processing, in particular during lithographic patterning.

Various technologies for clamping substrates to a substrate table or carrier have been developed.

In many applications electrostatic clamping is used. For charged particle beam exposure system such systems are undesired as they may introduce disturbances to the charged particle beam path. Further, electrostatic clamping requires electrical wirings between the substrate table and a power source. Such wiring is undesirable as it disturbs the movement of a stage carrying the substrate table.

As an alternative, substrate clamping based on capillary force has been developed for clamping rigid substrates such as semiconductor wafers. Systems and methods for capillary clamping are described in, for example, U.S. Pat. Nos. 8,705,010 B2, 9,460,954 B2, 8,436,324 B2, 8,991,330 B2, 8,514,370 B2. The methods and systems described in these documents enable accurately positioning substrates during exposure, as well as accommodating for a heat load provided on the substrate by the exposure radiation, typically by heat transfer from the substrate to the support.

Disadvantages of capillary clamping relate to a relatively high complexity of the methods and systems. Also, the time required to clamp a substrate to the support may be an issue. Further, scaling to substrates of different dimensions is also not a simple straightforward issue, but at least to some degree may require modification and/or redesign of the arrangements.

US 2004/0248420 A1 describes yet another type of clamping, directed to supporting flexible substrates during manufacture of display panels. The flexible substrate is supported by a temporary substrate via a buffer layer and an adhesive layer formed by an adhesive tape, a liquid adhesive, or an organic film. Alternatively, the adhesive layer can be realized by an electrostatic force. The arrangement proposed by US 2004/0248420 A1 is associated with certain complexity, e.g. regarding the requirements of the buffer layer.

Other systems where a wafer is temporary bonded to a support are, for example, disclosed in U.S. Pat. No. 7,541,264 B2, US 2014/0106137 A1, JP 2005-072496 A and US 2004/0192012 A.

It is an object of the present disclosure to provide a method and/or a system for clamping rigid substrates for applications having high requirements regarding surface flatness of the clamped substrate, overcoming or at least alleviating one or more of the disadvantages mentioned above.

SUMMARY

The disclosed embodiments provide methods for clamping a substrate, clamps formed by the substrate and the support to which it is clamped, and systems and arrangements for clamping a substrate to a support by means of adhesive material. The methods and arrangements according to the present disclosure are suitable for clamping semiconductor substrates during lithographic exposure for forming circuits or elements thereof. Such lithographic patterning or writing typically is directed to forming patterns with accuracy in the nanometer range.

Terminology

Clamping: By clamping a substrate is fixed or fastened to a support in a temporary manner, allowing the substrate to subsequently be unclamped, i.e. removed from the support, without breaking. Typical purposes include semiconductor lithographic exposure, such as patterning. The methods and arrangements disclosed herein below are particularly useful for clamping substrates for charged particle multi-beam exposure, such as lithography and/or inspection.

Rigid substrate: The methods and arrangements disclosed herein are primarily directed to clamping rigid substrates such as semiconductor wafers, e.g. silicon wafers. A rigid substrate can only to a very limited amount be bent or flexed without damage. At least some of the aspects and embodiments of the present disclosure can also be applied for clamping flexible substrates.

Support: The support is a structure supporting, e.g. holding or carrying, the substrate, for example during processing of the substrate and/or during transport of the substrate. In applications as lithography, the support holds the substrate during the exposure process, and is sometimes referred to as wafer table.

Clamp: A clamp is the combination formed by a substrate clamped to a support.

Adhesive material: Adhesive materials enable objects to be adhered or 'stick' to one another, that is, to be fastened with respect to one another by means of adhesive force. Adhesive materials encompass various types of adhesives, such as those generally referred to as glue, both single component and two-component adhesives, but also include resist materials and wax materials, or materials provided with adhesives surfaces, such as single or double sided tapes, sticky pads or tacs, etc.

Curing: During curing, the adhesive material undergoes chemical and/or physical changes or alterations such as to harden, or set, generally resulting in increased rigidity of the adhesive material.

Curing can be performed by active curing, whereby it is activated and/or the speed by which it occurs is increased, by exposure to electromagnetic radiation, in particular of a specified wavelength, by thermal energy, or by contact with a chemical element or substance, for example moisture or by mixing the two components of a two-component adhesive.

Alternatively, curing may be performed passively, for example by leaving it for certain time, without providing any radiation or other energy in addition to the ambient temperature, pressure, light, etc. Curing then takes place by a reaction or transformation of the adhesive occurring with time due to the properties of the adhesive, without exposure to other radiation than ambient light and/or temperature.

According to a first aspect, a method is provided for clamping a rigid substrate to a support, the method comprising, providing a support comprising a first surface defining a plane, applying adhesive material on portions of said first surface, placing the substrate onto the adhesive material, such that said adhesive material forms a plurality of support locations supporting said substrate, and curing said adhesive material.

The first surface defines a plane, supporting the substrate via the adhesive material. This plane is therefore herein also referred to as support plane. The adhesive material is applied on portions of said first surface, preferably multiple portions. Accordingly, the adhesive material does not form a full layer between the substrate and the support, but forms a plurality of support locations whereby voids are provided between the substrate and the support. This enables the clamped substrate to extend substantially in a second plane, also referred to as substrate plane, substantially parallel to the support plane defined by the first surface. Hence, the clamped substrate can have and maintain a required degree of flatness. Such required degree of flatness typically corresponds to a height variation of less than 10 µm over a clamped substrate having a diameter of 300 mm. Locally the flatness of the clamped substrate has been seen to be even better, corresponding to a height difference of 5 µm RMS or even less over distances of 15 mm over the substrate. A (local) flatness is important for example in applications such as charged particle beam lithography where the substrate is exposed by successively writing a pattern onto small areas of the substrate surface, which areas may have a width in the range of 15-30 mm.

The plane is generally substantially horizontal. In many applications, such as charged particle beam lithography, the target is oriented substantially horizontally during exposure.

Curing is performed after the substrate has been positioned on the support, and can be performed actively or passively. The adhesive material is substantially solid after curing.

The adhesive material is an adhesive material selected from the alternatives listed above. It may be substantially liquid, viscous or gel-like before curing, whereby after curing it is substantially solid and/or rigid. This enables at least partially compressing or deforming the adhesive material prior to curing, which can be used to improve the flatness of the clamped substrate, as will be described below.

After curing the adhesive material preferably is rigid or incompressible under the weight of the substrate. Hence, it will carry the weight of the substrate without being compressed by this weight, which is advantageous for the flatness of the substrate.

Preferably the adhesive material is applied onto the first surface, the substrate subsequently being positioned on top of the adhesive material. Alternatively, the adhesive material may be applied onto a surface of the substrate, and subsequently positioned on the first surface.

Clamping the substrate via a plurality of support locations is advantageous when the substrate has a thermal coefficient different from the thermal coefficient of the substrate, which is often the case. As the adhesive force is relatively low, and the adhesive material offers some degree of elasticity in lateral directions, the adhesive material can accept shear stress caused by thermal expansion of the substrate without breaking. Thereby the substrate can expand in directions parallel to the plane, i.e. in lateral and/or radial directions, without breakage of the adhesive material, substantially minimizing or at least reducing thermally induced bow of the substrate.

Although being relatively low, the adhesive force is sufficient to maintain the substrate clamped such that its surface is substantially parallel to the support plane. Semiconductor wafers generally have a bow or warp when not being clamped. The adhesive force prevents the clamped substrate to regain one or more of such bows or warps. Such bow or warp may have a measure of 10 µm or more, even up to 30 µm. The bow may be measured as the distance between the surface and the best fit plane at the center of the unclamped wafer.

Further, by the plurality of support locations the adhesive force is reduced in comparison to a full layer of adhesive. The substrate is hence clamped to the support with a relatively low clamping force. Thereby the substrate can be easily unclamped from the support without breaking the substrate.

Since the substrate is in contact with the support only via the support locations, which are preferably separated from one another, substantially thermal decoupling is provided between the substrate and the support. The support and the substrate can thermally expand and retract substantially independent of one another. The disclosed embodiments can therefore be applied, for example in multi-beam charged particle exposure systems, without arrangements for cooling the substrate and/or the support. As described above, the plurality of support locations formed by the adhesive material allows thermal expansion of the substrate.

The first surface area may be provided by a plurality of surface areas, which are not connected or abutting one another. For example, the first surface may be provided by a plurality of individual islands, formed by protrusions or pillars.

Alternatively, the first surface may be provided as a single, coherent, surface. Such single surface may be provided by the whole surface area enclosed by a perimeter. Alternatively, the first surface may be provided as a single surface having areas, for example grooves or hollows, located at a level below the plane, such that the area of the first surface is smaller than the surface area enclosed by a perimeter of the first surface area.

The definitions of the first surface and the plane defined by the first surface provided in the above paragraphs apply throughout the present disclosure. Unless otherwise stated, the same goes for the plurality of support locations.

According to a second aspect, a method is provided for clamping a rigid substrate to a support, the method comprising, providing a support comprising a first surface defining a plane, applying adhesive material on portions of said first surface, placing the substrate onto the adhesive material, such that said adhesive material forms a plurality of support locations supporting said substrate, and applying a substantially uniformly distributed force over the substrate in the direction of the support.

The substantially uniformly distributed force is applied onto the substrate in a direction towards the support, slightly forcing or pushing the substrate towards the adhesive material and towards the first surface. This may improve the attachment of the substrate to the support via the adhesive material.

The adhesive material preferably is at least to some degree compressed and/or deformed by the applied force, contributing to the resulting degree of flatness of the clamped substrate.

When the adhesive material is applied in a viscous or gel-like state, or in another compressible or deformable form, it can be at least partially compressed or deformed by the applied force. By applying a controlled amount of adhesive material to form each support location, when applying the substantially uniformly distributed force over the substrate the adhesive material will at least to some degree be compressed or deformed between the first surface and the substrate, orienting the substrate substantially within a second plane parallel to the plane defined by the first surface.

In some embodiments, the adhesive material can be provided with spacers, which preferably are sphere-shaped. The spacers limit the compression or deformation of the adhesive material, and may hence determine the minimum distance between the first surface and the substrate. The flatness of the substrate may therefore be improved by using such spacers. Adding spacers to the adhesive material may also relax the requirement of uniformity of the applied force.

The, preferably substantially uniform, force may be applied in combination with curing the adhesive material. Curing the adhesive material while being compressed and/or deformed contributes to the resulting degree of flatness of the clamped substrate.

According to a third aspect a method is provided for clamping a rigid substrate to a support, the method comprising, providing a support comprising a first surface defining a plane, applying adhesive material on portions of said first surface, and placing the substrate onto the adhesive material, such that said substrate rests on said adhesive material and overlies an area of said support, said area of said support forming a support area, wherein said adhesive material forms a plurality of support locations, said support locations being distributed over said support area.

By distributing the support locations over the support area not the full area located underneath the substrate forms support locations. This can be realized by applying the adhesive material in the form of individual areas, e.g. by individual drops, or by an adhesive patch, tac or pad provided with through-holes, openings, or similar.

Providing the support locations distributed over the surface of the substrate facing the first surface results in a relatively low adhesive force, strong enough to secure the substrate during exposure processes, while enabling easy unclamping without breaking the substrate. It further enables thermal expansion and/or retraction of the substrate, without breaking of the adhesive material at the support locations.

The support locations may be substantially symmetrically arranged with respect to a central point of said substrate. Alternatively, the support locations can be arranged in non-symmetrical arrangement, leading to an increased resonance frequency and hence reducing vibrations of the clamped substrate.

According to a fourth aspect, a method is provided for clamping a substrate to a support, the method comprising, providing a support comprising a first surface defining a plane, applying adhesive material on portions of said first surface, and placing the substrate onto the adhesive material, wherein said adhesive material forms a plurality of support locations, said adhesive material being arranged connecting at least a portion of said support locations with one another.

The connection of at least portions of the support locations with one another can be realized by applying the adhesive material in the form of one or more patches, pads or tacs, provided with one or more through holes, openings, or similar, as described above. This provides an easy manner of applying the adhesive material.

Alternatively, the adhesive material may be applied as individual areas forming interconnected areas and/or islands. In this case the adhesive material may be any of the adhesive materials defined above.

This provides a relatively low adhesive force, strong enough to secure the substrate during processing, while enabling unclamping without breaking the substrate. It further enables thermal expansion and/or retraction of the substrate.

The adhesive material may be applied in the form of a substantially monolithic material forming a distributed support area, the distributed support area being smaller than an area of said support located underneath the substrate.

This enables the adhesive material to be applied with a substantially uniform thickness, without the need for controlling the volume and/or height of individually adhesive drops or areas. This provides a relatively simple and/or quick manner of applying the adhesive material. The substantially uniform thickness of the adhesive material contributes to the flatness of the clamped substrate.

The substantially monolithic material may be a re-usable, preferably cleanable, material.

The adhesive material may be a material not requiring curing and/or hardening.

The features of the different aspects can be combined with one another, or can be applied separately, independently of one another.

All aspects have in common that the support comprises a first surface defining a plane and that adhesive material is applied on at least portions of this first surface, the adhesive material forming a plurality of support locations supporting the substrate, and the positioning of the substrate on the adhesive material.

Generally, a rigid substrate is clamped, for example a semiconductor wafer as discussed above. Typically, the substrate is of circular shape. The support, at least the portion thereof located underneath the substrate, can then also be circular.

All these aspects allow thermal expansion of the clamped substrate in directions substantially parallel to the plane defined by the first surface. Thereby a thermally induced bow in the substrate can be minimized or at least reduced. In the clamp, the adhesive material carries the weight of the substrate without being compressed thereby, while allowing shear stress caused by thermal expansion of the substrate, without the adhesive material breaking.

Both the thermal bow and the resonance frequency of the clamped substrate are influenced by the number of support locations and the area of each support location. The configuration and arrangement of support locations are realized as a trade-off between these two parameters; maintaining both parameters within acceptable limits.

In order to achieve the advantages described herein, it has been observed to be advantageous to distribute the total support area formed by the support locations over a relatively large number of support locations each having a relatively small surface area, rather than using only a few support locations of larger area. Therefore, preferably a relatively large number of support locations are used.

The number of support locations, as well as their positions, can also influence a resonance frequency of the clamped substrate.

For limiting the thermal bow, it has been seen to be advantages to have as low number of support locations as possible. However, in terms of reducing vibrations, it has been observed to be advantageous to have a higher number of support locations, since the resonance frequency has been seen to increase with increasing number of support locations.

Hence the number of support locations, and the surface area of each support location, is selected as a trade-off between the resonance frequency of the clamped substrate and the resulting thermal bow during processing of the substrate.

The importance or influence of the two parameters depends on the application in which the clamp is used, in particular the heat load experienced by the substrate and the speed and/or frequency of movement of the clamped substrate. For applications resulting in a relatively large heat load on the substrate, thermal bow will be critical, whereas if the heat load is limited or even negligible, the thermal bow will be a less critical parameter. For applications involving movement of the substrate, for example by a moving stage during lithographic patterning, which stage generally moves relatively fast, and generally also may accelerate and/or decelerate, the resonance frequency will be of importance as vibrations may be induced by the movement of the substrate.

Also the properties of the specific adhesive material play a role in the trade-off between thermal bow and resonance frequency and the selected arrangement of the support locations.

By using an adhesive material having higher adhesive force, the number of support locations could be reduced, while still maintaining the thermal bow of the clamped substrate during the intended processing within specified limits. However, reducing the number of support locations would have a negative effect on the resonance frequency, increasing the chance of vibrations in the clamped substrate.

The methods and arrangements for clamping a substrate to a support as described herein have been observed to provide a resonance frequency higher than 400 Hz and to enable limiting the thermal bow to 5 µm or less during multi electron beam lithography as described in e.g. U.S. Pat. Nos. 8,445,869 B2, 8,502,176 B2 and 9,455,112 B2.

The embodiments of the present disclosure may be used in applications involving a heat load on the substrate while having strict tolerances regarding thermally induced bow of the substrate, and requiring highly accurate and/or predictable positioning of the substrate, typically within the range of nanometers.

It has been observed that when adhesively clamping a substrate by means of a plurality of individual support locations as described herein, thermal expansion has only a limited contribution to overlay errors during charged particle beam lithographic patterning.

The adhesive clamping according to the present disclosure further offers a relatively cheap or at least less expensive manner of clamping.

Clamping using adhesive material according to the present disclosure offers a relatively quick and reliable method of clamping. A clamp can be formed within a few minutes, or even less. This may increase the throughput of an exposure system.

The methods as well as the corresponding arrangements, including the support, can be adapted for substrates of different dimensions. In general, the area of the first surface defining the plane will be sized dependent on the dimensions of the substrate to be clamped. Re-sizing is relatively easy, and does not require complex calculations and/or re-design. For example, the disclosed embodiment enables clamping of Silicon wafers having diameters of 200 mm, 300 mm, and 450 mm.

The different aspects may be realized and/or further defined according to one or more of the embodiments and alternatives described herein below.

The adhesive material is preferably applied in substantially liquid, viscous or gel-like form onto the at least portions of the first surface. This enables compressing and/or deforming the adhesive, in particular by applying a substantially uniform force to the substrate, to achieve a substantially constant, uniform height of the adhesive material at all support locations, providing a substantially constant distance between the first surface and the substrate. Hence, the substrate can be oriented in a substrate plane substantially parallel to the plane defined by the first surface.

The adhesive material may be subjected to curing, or other hardening or solidification process. This substantially fixates the substrate with respect to the support, and may be combined with the application of a force distributed over the substrate, to at least substantially deform the adhesive material during at least a part of the curing process. As described above, the adhesive material may be provided with spacers.

Curing may comprise exposing said adhesive material to electromagnetic radiation, thermal energy and/or a chemical substance. Thereby the curing process can be controlled, at least to a certain extent. The speed of curing and/or the order in which the adhesive material cures at different support locations can be controlled.

Curing may be effected by exposing said adhesive material to ultraviolet (UV) radiation. Obviously in such embodiments the adhesive material comprises a UV curable glue or adhesive. UV radiation can be provided by for example UV light emitting diodes (UV LEDs), which are readily available and easily positioned within a clamping arrangement.

The support can be at least partially transparent to electromagnetic radiation, and/or at least partially heat conductive. Curing may then comprise transmitting and/or conducting the electromagnetic radiation and/or the thermal energy through at least portions of said support. This enables applying the radiation and/or energy locally, and/or substantially homogeneously at all locations.

Curing generally results in the adhesive material being substantially incompressible under a weight of said substrate. When the plane is substantially horizontal, this means that the adhesive material is incompressible under the weight of the substrate in a direction normal with respect to the plane. This prevents sagging of the substrate under its own weight. Further, the support locations are preferably arranged such as to prevent sagging of the substrate in between the support locations. This contributes to the flatness of the clamped substrate.

Generally, the elasticity of the adhesive material allows a shear force, such as that caused by thermal expansion of the substrate, acting on the adhesive material at the support locations without causing breakage of the adhesive material.

This is typically achieved by the choice of the adhesive material to be used. Hence the rigid substrate can substantially maintain its flatness even if thermally expanding, preventing the substrate to bow, i.e. its surface deviating from the substrate plane, as a result of the thermal expansion.

The adhesive material may be provided with spacers, which are preferably substantially solid and/or rigid. The spacers put a limit to the amount the adhesive can be compressed by a force applied to the substrate, and thereby aid in providing a defined distance between said substrate and said plane. The spacers may be mixed into the adhesive material prior to applying the adhesive onto the first surface. Using spacers, it may also not be necessary that the force is uniformly distributed over the substrate, as long as the adhesive material is equally compressed at all support locations, e.g. as far as allowed by the spacers.

The adhesive material is preferably applied as a plurality of areas of adhesive, each area of adhesive forming a support location. Preferably the areas of adhesive are applied such as to be isolated from one another. Thereby, the adhesive material is not applied in areas located in between adjacent support locations. Alternatively, the adhesive is applied in a manner interconnecting said plurality of support locations.

The method preferably comprises controlling the volume of adhesive material applied to each area of adhesive. This enables controlling the thickness of adhesive material, and thereby the distance between the plane and the substrate, hence influencing the flatness of the clamped substrate. Controlling the volume of adhesive material is in advantageous when the adhesive material is applied forming separated areas, for example when the adhesive material is applied as individual drops onto the plane. By each drop of adhesive having substantially the same volume, the resulting height of the adhesive material, in particular after having applied a substantially uniform force onto the substrate after positioning this on the adhesive material, will be substantially the same at all support locations. The applied volume of adhesive material can be controlled manually or by using a dispenser robot.

The support locations are preferably distributed over an area covered by the substrate. That is, the adhesive material is distributed or arranged at a plurality of separate locations. This provides an adhesive force between the substrate and the support which is lower than if the substrate would be substantially completely adhered to the support.

In some embodiments, the support locations correspond to less than 1% of a surface of the substrate facing the support. This allows for thermal expansion of the substrate within its plane, while maintaining the substrate clamped to the support.

The support locations may be arranged positioned substantially along one or more concentric circles, centered at a central point under said substrate.

The support locations may be substantially symmetrically arranged with respect to a central point of said substrate. The symmetrical arrangement may be realized by the support locations being arranged on said first surface such as to provide mirror symmetry with respect to one or more planes normal to said plane.

The distribution of the plurality of support locations as well as the number of support locations may influence the resonance frequency of the clamped substrate and hence the chance of vibrations of the substrate. Breaking the symmetry of the distribution of the support locations may reduce the chance of vibrations in the substrate.

Curing may take place at least partly during application of a force to the substrate directed towards said support. The force is generally substantially uniformly distributed over the substrate. As discussed above, this enables providing a uniform height of the adhesive material at all support locations, providing the substrate plane substantially perpendicular to the support plane.

The substantially uniformly distributed force is preferably applied by providing a pressure difference over said substrate. The pressure difference can be provided by reducing pressure in a space between said substrate and said support, generally by at least partly evacuating the space, i.e., forming a vacuum in the space. This allows application of a force without physically interacting with an upper surface of the substrate which is generally provided with a resist layer and often patterned, for example by circuit elements.

A relatively low pressure difference has been seen to suffice for achieving a sufficient adhesive force and/or compression of the adhesive material, in particular when the support locations represent only a small fraction of the area underneath the substrate. A pressure difference of less than 10 mbar, or even less than 5 mbar, has been observed to be sufficient to achieve clamping.

Clamping is preferably performed in a controlled atmosphere, thereby avoiding or at least minimizing contamination of the substrate and/or the support.

According to a fifth aspect, a method of unclamping a rigid substrate which is clamped to a support via adhesive material forming a plurality of support locations, the substrate extending in a substrate plane, is provided, the method comprising, applying a force at one or more locations along a periphery of a surface of the substrate facing the support, said force applied with a direction component perpendicular to said substrate plane, and subsequently lifting the substrate from the support.

As discussed above, the plurality of support locations provided by the adhesive material provides a relatively low adhesive force between the substrate and the support. Thereby, a relatively low force is sufficient for unclamping the substrate from the support.

The force is applied at a peripheral area of the surface facing the support, and directed away from the support.

The force may be applied subsequently at multiple locations along the periphery. For example, it can be applied at two or three different locations, reducing the amount of inclination of the substrate and/or the bending forces acting on the substrate during unclamping. The locations are preferably substantially uniformly distributed along the periphery.

Unclamping may comprise exposing at least a part of the adhesive material to electromagnetic radiation and/or a chemical substance prior to applying said force. Exposing the adhesive to radiation of a wavelength influencing one or more properties of said adhesive material can lower the adhesive force provided by the adhesive material. As a result, the force required for unclamping the substrate is reduced.

After having separated the substrate from the support, generally the substrate is cleaned of any residues of adhesive material using a solvent, for example a detergent solution. Alternatively or additionally, unclamping may comprise mechanically removing residues of said adhesive material from said substrate, for example by a mechanical treatment such as scrubbing or polishing the surface.

The methods for clamping a rigid substrate to a support can be performed using a clamping arrangement according to any one of the aspects and their different embodiments described in herein below. These arrangements for clamping provide effects and advantages similar or corresponding to the effects and advantages discussed above with respect to the methods.

The arrangements provide forming a clamp allowing thermal expansion of the substrate in directions parallel to the plane defined by the first surface, without the adhesive material breaking.

The arrangements can be relatively easily adapted and/or re-sized to different dimensions and/or shapes of the substrate to be clamped.

The different aspects enable forming a clamp in a relatively short amount of time, typically on the order of a few minutes.

According to a sixth aspect, a clamping arrangement is provided for clamping a rigid substrate to a support, the arrangement comprising, a support comprising a first surface, for supporting said substrate via adhesive material, said first surface defining a plane, and an arrangement for exposing the adhesive material to electromagnetic radiation, thermal energy, and/or a chemical substance, when the adhesive material is located on at least portions of said first surface.

The arrangement for exposing the adhesive material to electromagnetic radiation and/or thermal energy enables actively curing the adhesive material, and/or actively reducing its adhesive strength.

According to a seventh aspect a clamping arrangement is provided for clamping a rigid substrate to a support, said clamping arrangement comprising, a support comprising a first surface, for supporting said substrate via adhesive material, said first surface defining a plane, and an arrangement for applying a substantially uniformly distributed force onto the substrate in the direction of said support when said substrate is supported by said first surface.

According to an eighth aspect a clamping arrangement is provided for clamping a rigid substrate to a support, the arrangement comprising, a support comprising a first surface, for supporting said substrate via adhesive material, said first surface defining a plane, wherein said first surface comprises a plurality of islands, wherein said islands are distributed over a support area to be overlaid by said substrate.

The islands may be substantially symmetrically arranged with respect to a central point of said substrate.

The adhesive material, which is an adhesive material as described herein above, may also be considered part of the arrangement.

According to a ninth aspect a clamping arrangement is provided for clamping a rigid substrate to a support, the arrangement comprising, a support comprising a first surface, for supporting said substrate via adhesive material, said first surface defining a plane, and adhesive material in the form of a substantially monolithic patch forming a distributed support area, which distributed support area is smaller than an area enclosed by a periphery of said patch.

The features of the clamping arrangement according to the different aspects can be combined with one another, or can be applied separately, independently of one another.

The different aspects may be realized and/or further defined according to one or more of the embodiments and alternatives described herein below. The various embodiments and alternatives of clamping arrangements provide effects and advantages similar or corresponding to the effects and advantages described above.

The clamping arrangement may comprise one or more sources of electromagnetic radiation and/or thermal energy.

The sources of electromagnetic radiation and/or thermal energy preferably comprise a plurality of individually or group wise controllable sources. This enables controlling the electromagnetic radiation and/or thermal energy, for example to successively cure different areas of adhesive material.

The source of electromagnetic radiation may be a source for emitting UV radiation, preferably provided by a plurality of UV light emitting diodes (LEDs).

When the arrangement comprises one or more sources of electromagnetic radiation and/or thermal energy, the support is preferably at least partly transparent to said electromagnetic radiation and/or conductive to said thermal energy. The sources of electromagnetic radiation and/or thermal energy can then be positioned on a side of the support facing away from the substrate, and arranged such that the radiation or energy is transmitted and/or conducted through the support.

The first surface can be realized in different ways, as described above. The first surface generally comprises a plurality of islands, each island having an island surface, said island surfaces together defining said plane. The term island herein typically refers to a point location or to a surface area. The islands can be separated from one another, i.e., not abutting, or be connected to one another.

When used together with a source of radiation or energy to be exposed onto the adhesive material, the islands are generally at least partly transparent to said electromagnetic radiation and/or thermal energy.

The islands are preferably provided as plurality of protrusions from said support. This enables providing a plurality of support locations within a plane, the support locations being separated from one another.

The islands are preferably distributed over the part of the support receiving the substrate, enabling thermal expansion of the substrate in all directions within its plane. In some embodiments, the islands are arranged substantially along one or more concentric circles.

Generally, a total area of said island surfaces is smaller than a total surface area located underneath said substrate when said substrate is positioned on said support. The adhesive material can then be applied onto substantially the whole first area, while providing a reduced adhesive force in comparison to if the full area between the substrate and the support would be provided with adhesive material. The total area of said island surfaces may represents less than 1% of a total surface area located underneath the substrate.

In some embodiments, the islands are arranged substantially symmetrical with respect to a central point of said substrate. The islands may be arranged with mirror symmetry with respect to one or more planes normal to the support plane. The mirror symmetry typically comprises mirror symmetry with respect to at least two different planes.

The clamping arrangement preferably comprises an arrangement for applying a force, generally a substantially uniformly distributed force, onto the substrate in the direction of said support when said substrate is supported by said first surface. As discussed above, if the adhesive material is compressible and/or deformable, the distance between the substrate and the plane defined by the first surface can be determined, i.e., the orientation of the substrate can be defined by the deformation of the adhesive material resulting from the force.

The arrangement for applying a substantially uniformly distributed force preferably comprises a pressure reduction device arranged for reducing a pressure in a space between said substrate and said support. As discussed above, this enables applying the force without damaging the surface of the substrate facing away from the support.

The clamping arrangement may comprise a dispenser robot for controlling the amount of adhesive material applied at different locations.

According to a tenth aspect, a clamp is provided, the clamp formed by a substrate clamped to a support according to the methods described above, and/or in a clamping arrangement as described above.

According to an eleventh aspect, a lithography system comprising a clamping arrangement as described above and/or a system for clamping a substrate to a support as described above.

The lithography system may further comprise one or more exposure apparatuses for exposing said substrate to radiation, said substrate having been clamped to a support by the clamping arrangement and/or by the method.

The exposure apparatus is typically a charged particle multi-beam lithography apparatus for exposing the substrate for forming a pattern thereon, for example forming circuit elements or parts thereof.

According to a twelfth aspect, a manufacturing plant is provided, the manufacturing plant comprising or being provided with a clamping arrangement as described above, a system for clamping a substrate to a support according to the method described above, and/or a lithography system as described above.

BRIEF DESCRIPTION OF THE DRAWINGS

Embodiments will now be described, by way of example only, with reference to the accompanying schematic drawings in which corresponding reference symbols indicate corresponding parts, and in which.

The figures are intended for illustrative purposes only, and do not serve as restriction of the scope or the protection as laid down by the claims.

DETAILED DESCRIPTION

Figure 1:
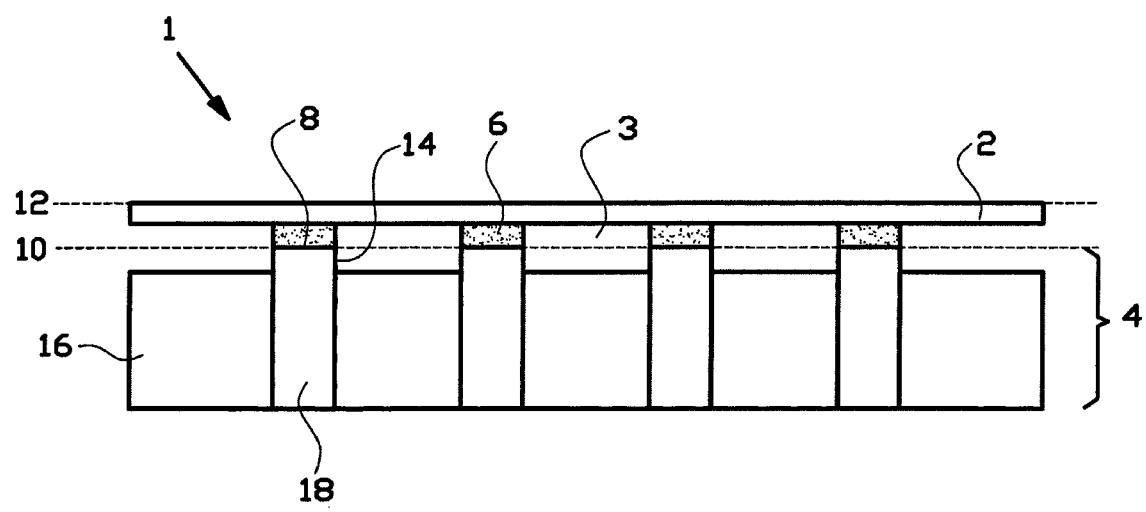
FIG. 1 shows a conceptual illustration of a substrate clamped to a support according to embodiments of the present disclosure.

FIG. 1 illustrates a cross section of a clamp 1 comprising a substrate 2 clamped to a support 4 by means of adhesive material 6. The substrate 2 is typically a semiconductor substrate, such as a silicon wafer, whereby the support 4 may be referred to as wafer table. The support 4 comprises a first surface 8 defining a plane 10, also referred to as support plane. The substrate 2 is supported on the first surface 8 via the adhesive material 6, which forms a plurality of support locations.

When clamped the substrate extends within a second plane 12, referred to substrate plane, substantially parallel to the support plane 10. The plane 10 defined by the first surface and the adhesive material 6 provided thereon enables the substrate to be clamped such as to be substantially flat within the substrate plane 12. The support locations are arranged such that the substrate does not sag under its own weight, and such as to allow thermal expansion of the substrate within the plane.

As can be seen, the adhesive material 6 does not form a full layer underneath the substrate 2, but leaves voids 3 between the substrate 2 and the support 4. The adhesive material is arranged to form support locations, which are typically formed by individual areas of adhesive material distributed under the substrate 2. This provides the substrate to be clamped to the support with a low adhesive force, and allows thermal expansion of the substrate 2 within the substrate plane 12, with minimized or at least reduced thermal bow. Such thermal bow would reduce the flatness of the substrate, making it deviate from the substrate plane 12. The adhesive material is selected such as to allow the shear forces within the plane caused by differences in thermal expansion of the substrate and the support, without the adhesive material breaking.

The adhesive force is strong enough to secure the substrate during exposure processes as well as to withstand a tendency in the substrate to at least partly regain, or reshape into, a bow or warp which was present in the substrate prior to clamping, thereby maintaining the substrate surface oriented flat within the substrate plane. At the same time the adhesive force is low enough to allow thermal expansion of the substrate within the plane, for example during charged particle beam lithography and/or inspection. At the same time, the low adhesive force enables easy unclamping without breaking the substrate.

In the embodiment illustrated in FIG. 1, the support 4 comprises a support base 16, provided with pillars 18 forming a plurality of islands 14. The first surface 8 is formed by the top surface of the plurality of islands 14. The islands 14 thereby together define the plane 10. The total area of the top surfaces is typically much smaller than a total surface area located underneath the substrate. The total area typically represents only a fraction of the substrate area. Preferably the support locations correspond to less than 10%, or even as little as 1% or less, of the substrate surface facing the support.

As indicated in FIG. 1, the pillars 18 can be formed by another material than the base 16, the pillars 18 extending through the base. When electromagnetic radiation is used to cure the adhesive material the pillars 18 are preferably transparent to this radiation. This allows positioning the sources of radiation on the rear of the support base, providing the electromagnetic radiation efficient access to the adhesive material in a localized manner.

In some embodiments, the support base 16 comprises aluminum and the pillars 18 are made of borosilicate glass, for example a borosilicate glass also known as Pyrex, which is substantially transparent to ultraviolet (UV) radiation.

Alternatively, the support base 16 can be monolithic, the islands 14 provided by protrusions from the monolithic base. When used together with sources of electromagnetic radiation, the support base can be made of a monolithic piece of material transparent to at least certain wavelengths of the radiation. In other embodiments, not involving exposing the adhesive material to electromagnetic radiation, or at least not from below the support, the whole support base 16 can be made non-transparent to the radiation.

Figure 2:
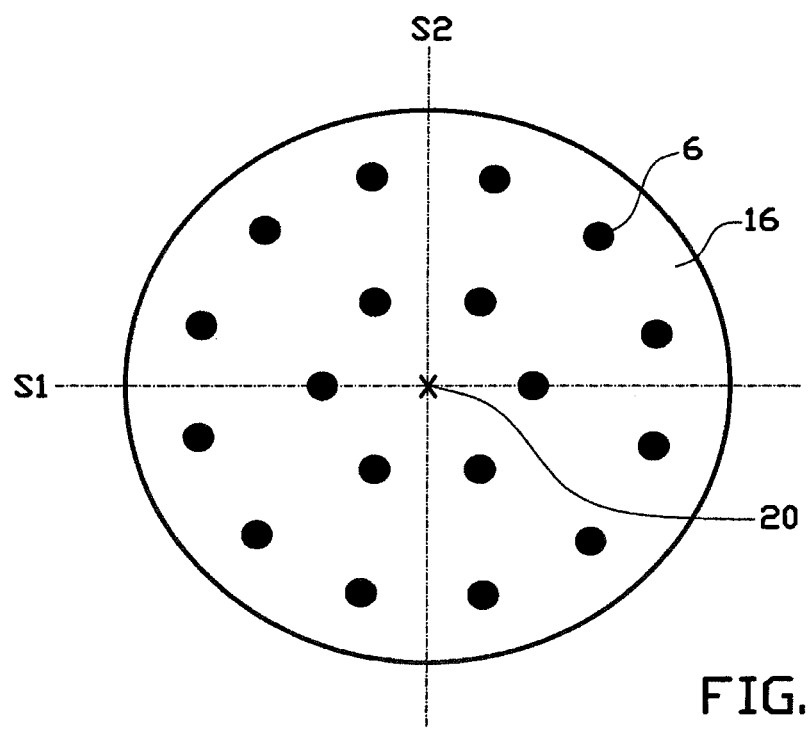
FIG. 2 shows a schematic illustration of a distribution of adhesive material forming support locations according to embodiments of the present disclosure.

FIG. 2 shows a schematic top view of a distribution of adhesive material in an island configuration, where the plurality of support locations are formed by areas of adhesive material 6 applied on islands on the base 16, for example as illustrated in FIG. 1.

The islands of adhesive material 6, and hence the support locations, are positioned on two substantially concentric circles, having their center at a central point 20. The number of concentric circles may be selected dependent on the size of the substrate to be clamped. The support can hence be easily configured in dependence on the substrate to be clamped.

The islands with adhesive material 6 may be symmetrically arranged with respect to the central point 20, for example with mirror symmetry with respect to two different planes S1, S2 normal to the support plane 10 shown in FIG. 1.

Alternatively, the islands with adhesive material 6 are not fully symmetrically arranged with respect to the central point 20. This may increase the resonance frequency of the clamped substrate, thereby reducing vibrations in the substrate.

Figure 3:
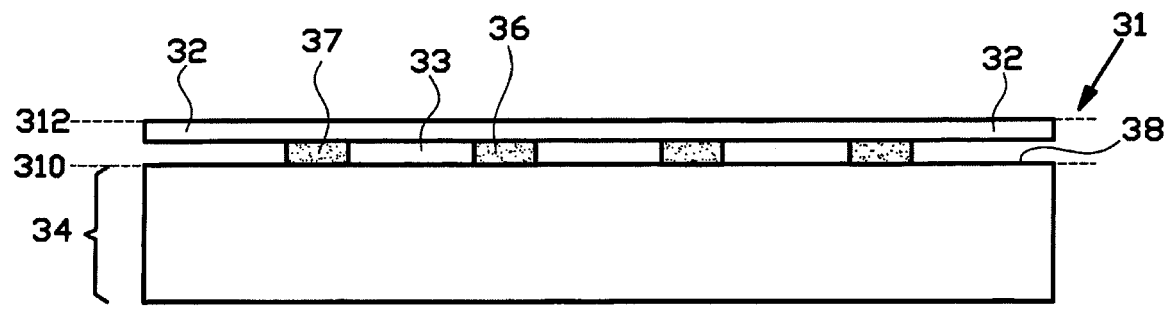
FIG. 3 shows a conceptual illustration of a substrate clamped to a support according to embodiments of the present disclosure.

FIG. 3 shows another embodiment of a clamp 31, formed by a substrate 32, for example a semiconductor wafer, clamped to a support 34 via adhesive material 36. Analogous to the embodiment of FIG. 1, the support 34 comprises a first surface 38 defining a support plane 40. However, in the embodiment of FIG. 3, the first surface 38 is formed by a coherent surface area of the support 34. For example, substantially the whole surface of the support 34 located underneath the substrate 32 can form the first surface 38, as long as it is sufficiently flat to define the plane 40 allowing the substrate 32 to be clamped with its upper surface extending within a substrate plane 42 substantially parallel to the plane 40.

The adhesive material 36 is arranged to form support locations 37. As can be seen, also in this embodiment the adhesive material 36 does not form a full layer underneath the substrate 32, but there are voids 33 between the substrate 32 and the support 34.

The total area of the support locations 37 is much smaller than a total surface area located underneath the substrate 2, preferably representing only a fraction of the surface area under the substrate.

The adhesive material 36 can be arranged in an island configuration, similar to the configuration of FIG. 2. However, since the first surface 38 is formed by a coherent surface, there are more options for how to apply or distribute the adhesive material on the first surface 38, for example in the form of elongated strips, or in configurations as illustrated in FIGS. 4 and 5.

In the embodiment of FIG. 3, the support 34 is typically monolithic. When an adhesive material is used which is cured by electromagnetic radiation, the support may be at least partly transparent to this radiation.

Figure 4:
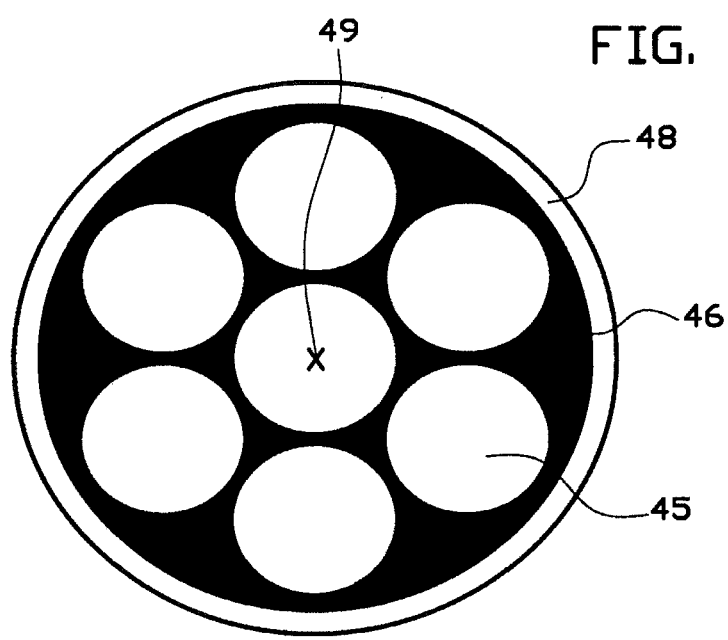
FIG. 4 shows a schematic illustration of a distribution of adhesive material according to embodiments of the present disclosure.
Figure 5:
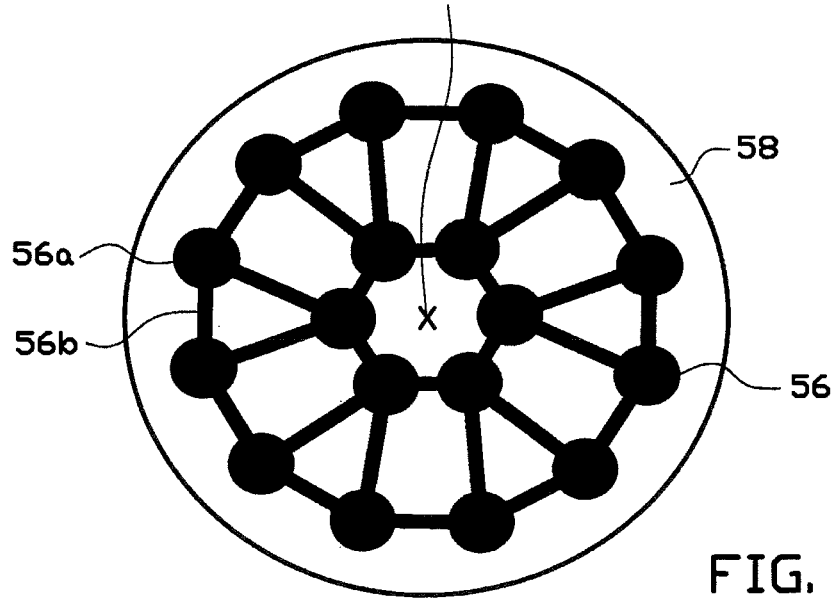
FIG. 5 shows a schematic illustration of a distribution of adhesive material forming according to embodiments of the present disclosure.

FIG. 4 shows a distribution of adhesive material 46 which forms a coherent area on the surface 48. Also in this embodiment, the adhesive material 46 does not form one complete layer, but provides voids between the substrate and the support. The support area formed by the adhesive material 46 is smaller than an area enclosed by its periphery.

The adhesive material 46 may be provided in the form of a monolithic patch or pad, having holes or apertures 45 providing the voids. Alternatively, adhesive material can be applied onto the first surface 48 by closely spaced drops of adhesive. Further alternatively, the adhesive material may be formed of for example a resist layer or a wax layer, or similar.

The adhesive material 46 may provide support locations symmetrically arranged with respect to a central point 49.

FIG. 5 illustrates a further distribution of adhesive material 56 forming a coherent area. The adhesive material 56 can be seen to conceptually represent an inverse of the concept illustrated in FIG. 4. The adhesive material 56 does not form one complete layer, but provides voids between the substrate and the support. The support area formed by the adhesive material 56 is smaller than an area enclosed by its periphery.

The adhesive material 56 may be provided in the form of a patch or pad, where support areas 56a forming support locations are connected by connection areas 56b. Further alternatively, the adhesive material may be formed of for example a resist layer, a wax layer, or similar.

The thickness of the connection areas 56b in a direction perpendicular to the surface 58 may be less than the thickness of the support areas 56a, such that the connection areas 56b do not form support locations supporting the substrate on the support. Alternatively, adhesive material can be applied onto the first surface 58 by drops of adhesive.

The adhesive material 56 may provide support locations in an arrangement symmetric with respect to a central point 59.

A method of clamping, forming a clamp for example as illustrated in FIG. 1 or FIG. 3, is described with reference to FIGS. 6A to 6D. The substrate 62 is typically a semiconductor substrate. The method is preferably performed in a controlled atmosphere, having a controlled and limited degree of species which might contaminate the clamp.

Figure 6A:
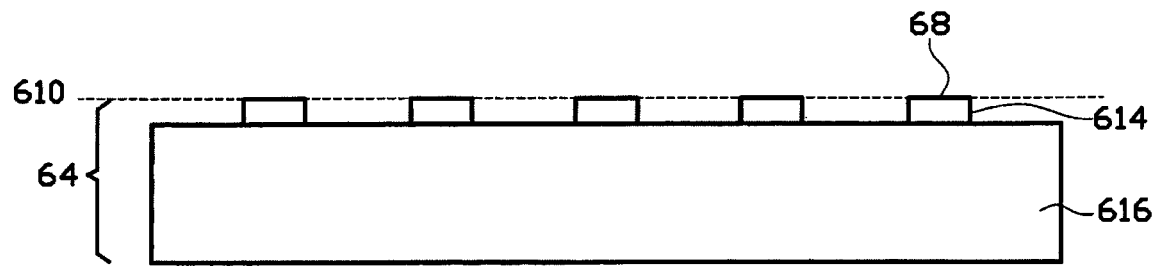
FIGS. 6A to 6D schematically illustrate a method of clamping according to embodiments of the present disclosure.

As illustrated in FIG. 6A, a support 64 having a first surface 68 defining a plane 610 is provided. In the illustrated embodiment, the first surface 68 is formed by protrusions 614 extending from the support base 616, for example formed by pillars as described with reference to FIG. 1. The plane 610 is generally horizontal, representing a plane parallel to the plane in which the substrate is to be arranged during the processing for which it is being clamped.

Figure 6B:
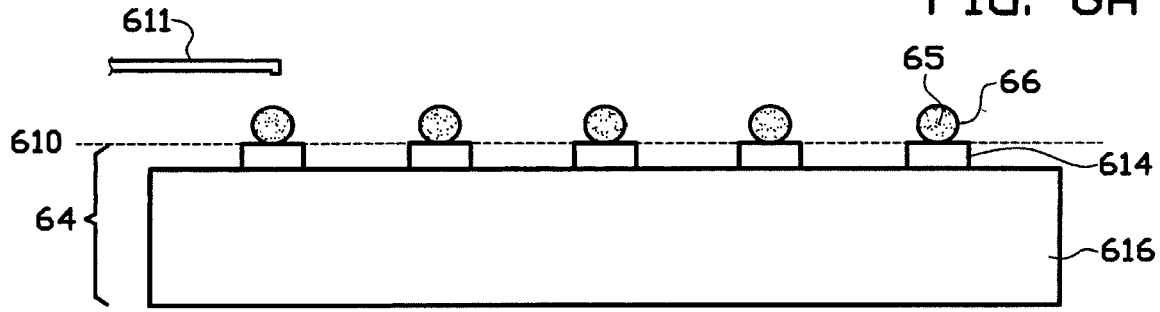

Adhesive material 66 is applied onto the top surface of the protrusions 614 forming the first surface 68, as shown in FIG. 6B. Upon application the adhesive material 66 is a viscous or gel-like substance, a drop 65 of which is applied on each protrusion 614. These drops 65 will form the plurality of support locations 67 for the clamped substrate.

Preferably, each drop 65 of adhesive material has a controlled volume, which is the same for all drops 65. This can be achieved for example by a dispenser robot 611, moveable with respect to the support 64 and controlling the amount of adhesive material applied at each location. The distance between the clamped substrate and the first surface 68 will be influenced by the amount of adhesive material applied to each pillar.

In order to improve control of the distance, spacers may be added to the adhesive material 66 prior to dispensing the adhesive material onto the protrusions 614.

Figure 6C:
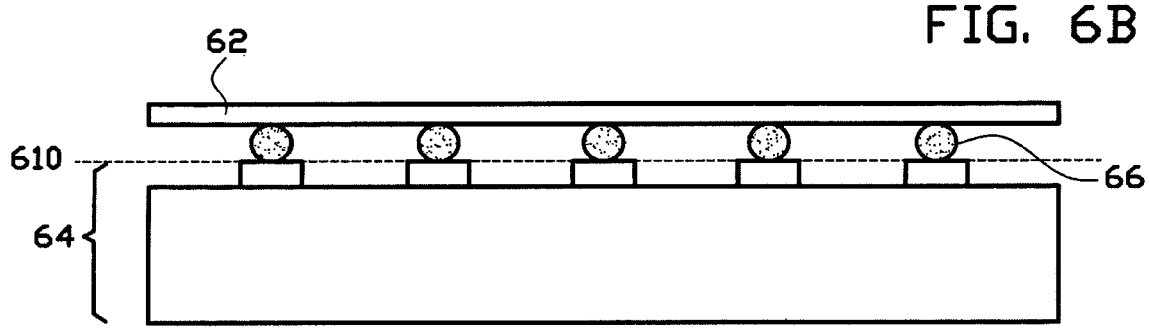

Subsequently, as shown in FIG. 6C the rigid substrate 62 is positioned on the adhesive material 66. At this moment the substrate 62 rests on the adhesive material 66 but is not yet clamped. Prior to hardening or curing of the adhesive material 66, the position, in particular a rotational position with respect to a central normal axis, of the substrate can be slightly adjusted.

Figure 6D:
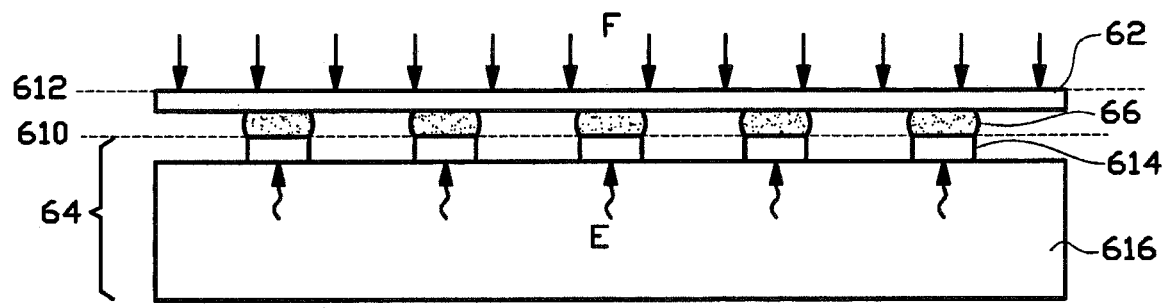

As illustrated in FIG. 6D, when the substrate 62 has been positioned on the support 64 via the adhesive material 66, a substantially uniformly distributed force F is applied over the substrate, slightly pushing the substrate 62 toward the support. The force F is preferably provided by reducing the pressure in the space between the substrate and the support. The adhesive material 66, still in the viscous or gel-like form, deforms by the applied force. Due to the flatness of the support plane 610 and the defined volume of adhesive material 66 at each support location, the substrate 62 will be oriented in a substrate plane 612 substantially parallel to the support plane 610.

As mentioned above, the flatness of the clamped substrate may be improved by adding spacers to the adhesive material. The spacers limit the amount the substrate can be pushed toward the top surface of the protrusions 614. The distance between the substrate and the top surface of the protrusions can thereby be defined by the spacers. If such spacers are provided, the applied force is not necessarily uniformly applied, since the spacers limit the amount of deformation of the drops of adhesive material.

At least partly during the application of the force F the adhesive material 66 is cured. In the method step illustrated in FIG. 6D, the adhesive material is cured by exposing it to energy in the form of electromagnetic radiation E, for example ultraviolet (UV) light.

The UV light is preferably directed to the adhesive material via portions of the support base 616 transparent to UV light. The UV light may be controlled such that the adhesive material 66 does not cure at the same time and/or with the same speed at all locations. It has been observed that this can be advantageous for the flatness of the clamped substrate.

Once the adhesive material 66 has cured, at least to a sufficient degree such as to maintain the substrate 62 within the substrate plane 612, the substrate has been clamped to the support. The force F and the electromagnetic radiation E are removed and/or switched off.

In the embodiment illustrated in FIGS. 6A to 6D, the first surface 68 is formed by protrusions 614 extending from the support base 66. Alternatively, the first surface 68 may be provided by an upper surface of the support base 66, e.g. as illustrated in FIG. 3. The adhesive material may be applied in the form of drops forming separated locations as described above, or, alternatively, forming one or more coherent areas as described with reference to FIGS. 4 and 5.

An arrangement 70 for clamping a substrate to a support using the methods described above is schematically illustrated in FIG. 7.

The clamping arrangement 70 comprises a support 74. This can be a support 4 as illustrated in FIG. 1, a support 34 as illustrated in FIG. 3, or a support 64 as illustrated in FIG. 6A to 6D. The support 74 comprises a base, or substrate table, 716 provided with protrusions 714 the top surface of which define the support plane, for supporting and clamping the substrate 72 via adhesive material 746, as illustrated in FIGS. 1, 3 and 6A to 6D. The adhesive material can be selected from the different types of adhesive material discussed above.

The clamping arrangement 70 comprises a plurality of electromagnetic radiation sources 760, for example UV LEDs, for applying radiation of a specified wavelength onto the adhesive material such as to influence one or more of its properties. Lenses 761 may be provided for focusing the light emitted by the electromagnetic radiation sources 760 at areas of the adhesive material forming support locations.

The electromagnetic radiation sources 760 and the lenses 761 are mounted to an arrangement base 76.

The clamping arrangement further comprises a vacuum pump 78 or other means for providing a pressure difference over the substrate 72 by reducing the pressure in the space 73 between the substrate 72 and the support 74. This enables applying the substantially uniformly distributed force acting on the substrate 72 in a direction toward the support 74. Typically, only a small pressure difference over the substrate 72 is needed in order to achieve sufficient flatness of the clamped substrate. This pressure difference can be as small as 5 to 10 mbar.

In order to enable the space 73 between the substrate 72 and the support 74 to be evacuated, the substrate table 716 is provided with a rim 741, providing a seal between the substrate 72 and the support 74. However, since the flatness of the clamped substrate is defined by the support plane 710, in combination with the adhesive material applied thereon, the rim 741 is somewhat lower than the support plane 710, such as not to abut the substrate 72. Thereby a very small gap is present between the substrate 72 and the rim 741, which may be on the order of a few μm.

The vacuum pump 78 is connected to the space 73 via a conduit 781 connected to an opening 742 in the support 74 via a sealing 782, such as a gasket. The opening 742 is preferably located in a center of the support 74.

Figure 7:
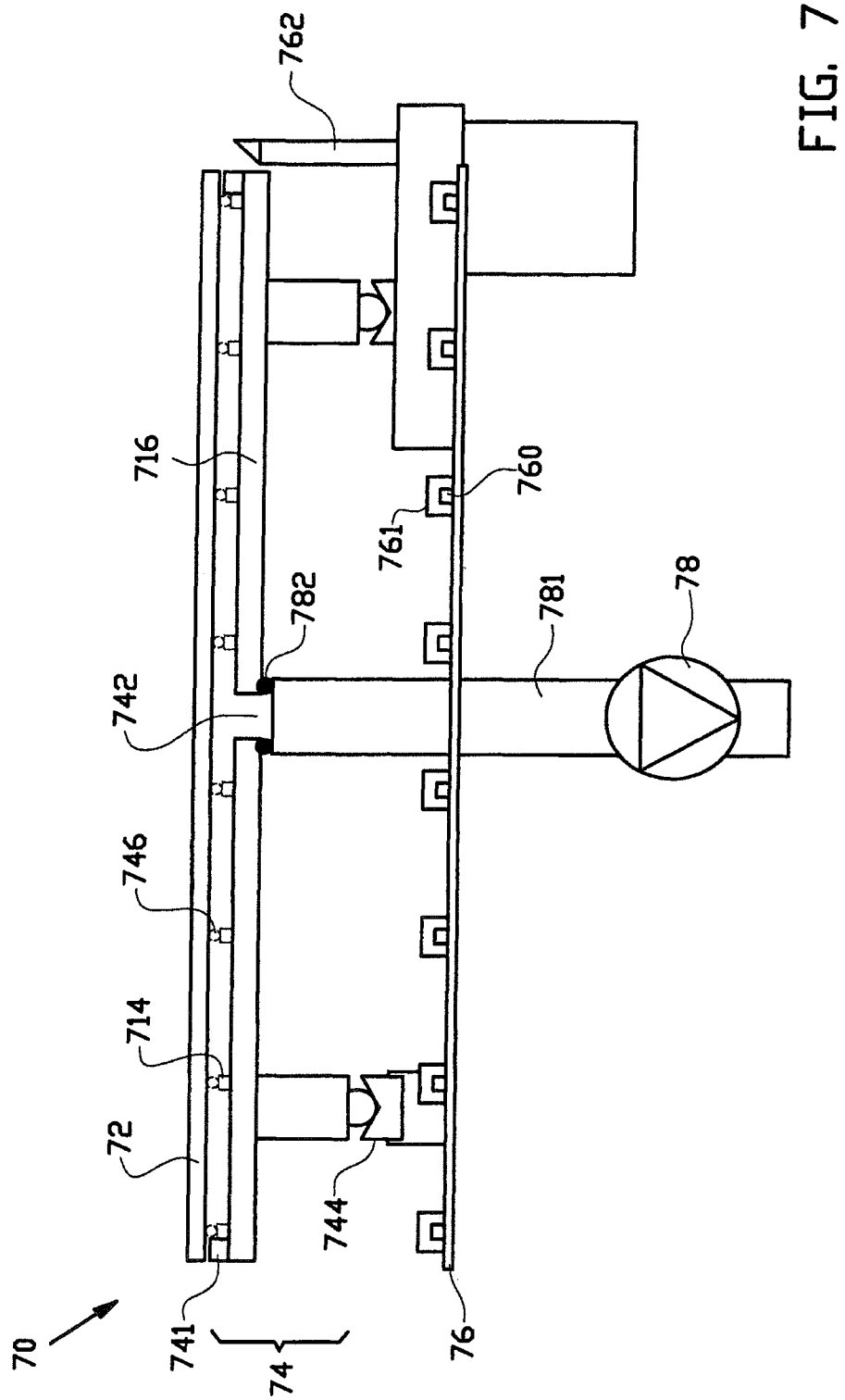
FIG. 7 shows a schematic illustration of an arrangement for clamping according to embodiments of the present disclosure.

The support 74 is preferably mounted to the base 760 via three kinematic mounts 744, two of which are illustrated in FIG. 7. The kinematic mounts 744 provide accurate positioning of the support base 74 on the arrangement base 76, in particular with respect to the conduit 781 and the electromagnetic radiation sources 760. Accurate positioning of the support 74 with respect to the radiation sources 760 is important in order to be able to expose the adhesive material to the electromagnetic radiation in a defined manner.

Once the clamp comprising the substrate 72 and the support 74 has been formed it can be removed from the arrangement base 76, and moved to a location for processing the substrate 72, for example by insertion into a charged particle beam exposure apparatus. Such apparatus generally comprises an arrangement forming a kinematic mount with the support 74, similar to the kinematic mount 744 in the clamping arrangement 70.

A dispenser robot (not illustrated) or similar arrangement may be provided for applying the adhesive material in a controlled manner, prior to positioning the substrate 72 onto the support 74, as described with reference to FIG. 6B.

The clamping arrangement further preferably comprises one or more control units, for controlling the radiation sources 760, the dispenser robot, the vacuum pump 78, and one or more lift pins 762, which will be described below.

The clamping arrangement 70 comprises one or more lift pins 762 which are movable with respect to the arrangement base 76. Preferably three lift pins 762 are provided. The lift pins can be extracted and/or retracted along a direction substantially normal to the support plane and/or the substrate. With these lift pins the substrate 72 can be lowered onto the support 74 and/or lifted from the support 72. The lift pins 72 can be used for unclamping the substrate from the support, for example as described with respect to FIG. 9A to 9C. The lift pins may further determine the alignment of the substrate within the substrate plane.

Figure 8:
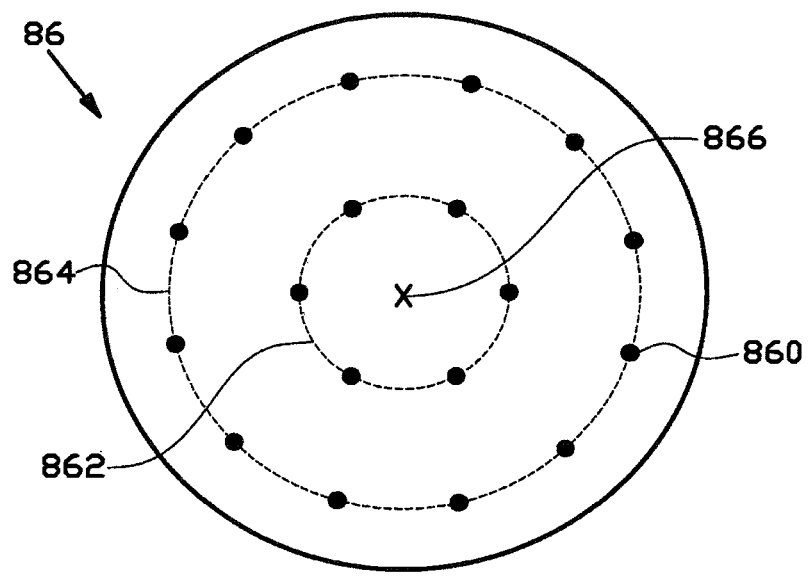
FIG. 8 schematically illustrates an arrangement of sources of electromagnetic radiation for an arrangement as illustrated in FIG. 7 according to embodiments of the present disclosure.

FIG. 8 shows a schematic representation of a plurality of electromagnetic radiation sources 860 provided on a base 86 of a clamping arrangement for clamping a substrate to a support using adhesive material. The electromagnetic radiation sources 860 and the base 86 may for example represent the sources 760 and the base 76 of the clamping arrangement 70 described with reference to FIG. 7.

The sources 860 are arranged on two concentric circles 862, 864 centered at a point 866. The central point 866 may be located in the clamping arrangement such that a central point of the substrate to be clamped is positioned substantially over the point 866.

The sources 860 are preferably connected to a control unit such as to be individually and/or group wise controllable.

Figure 9A:
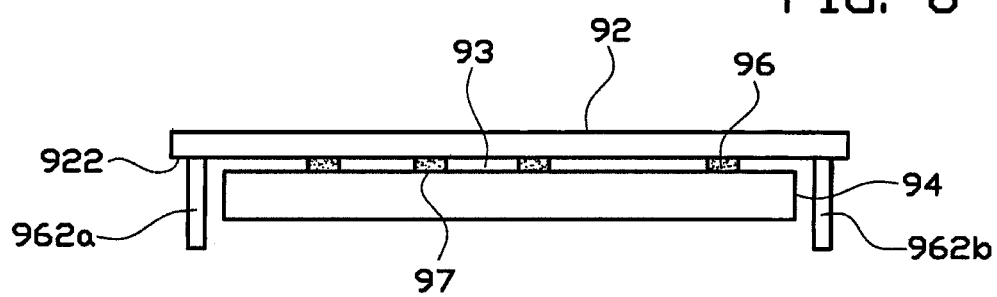
FIGS. 9A to 9C schematically illustrate a method of unclamping according to embodiments of the present disclosure.
Figure 9B:
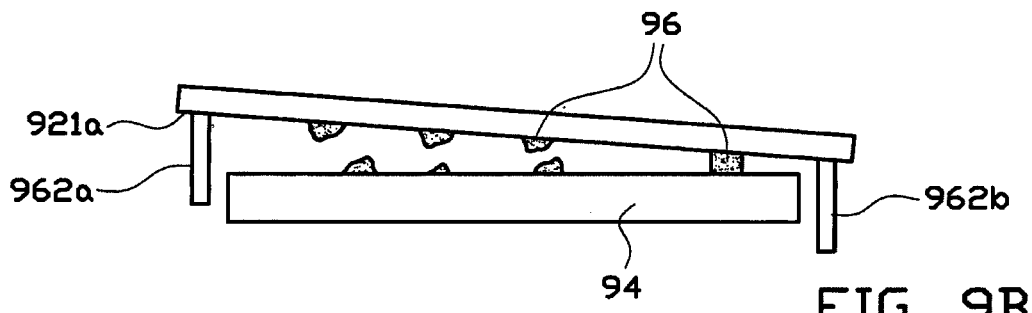
Figure 9C:
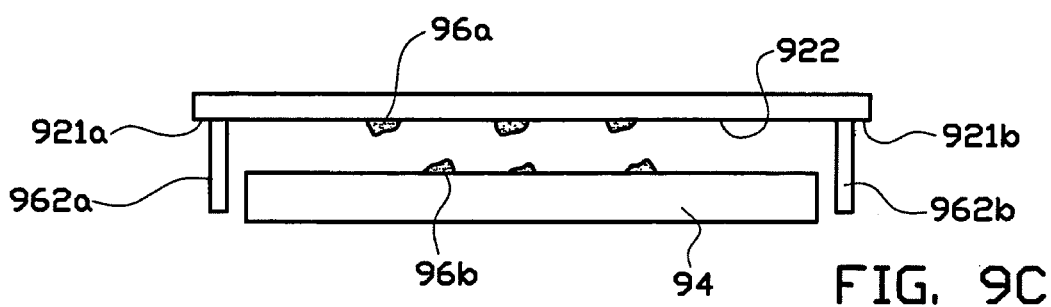

A method of unclamping a substrate from the support to which it is clamped, is illustrated in FIGS. 9A to 9C. The clamp comprises a substrate 92 clamped to the support 94 via adhesive material 96 forming a plurality of support locations 97. The method of unclamping may be performed in a clamping arrangement 70 as illustrated in FIG. 7 or in a separate unclamping arrangement.

In FIG. 9A, the clamp is located such that a part of the lower surface 922 of the substrate 92 is located above lift pins 962. When the method is performed in the clamping arrangement 70 illustrated in FIG. 7 the lift pins 962 correspond to the lift pins 762.

As illustrated in FIG. 9B, a force is applied to a peripheral part 921a of the surface 922 by moving one of the lift pins 962a upwards. The force is applied such that at least a component thereof is perpendicular to the substrate plane prior to application of the force. As the lift pin 962a moves upwards and a slight tilt of the substrate increases, the adhesive material 96 successively breaks at different support locations 97.

As shown in FIG. 9C, a second lift pin 962, and preferably a third lift pin (not illustrated), are subsequently moved upwards, applying a force at different peripheral areas 921b of the lower surface 922, until the adhesive material has broken at all support locations 97, and the substrate 92 is lifted from the support 94.

Since the support locations 97 occupy only a part of the lower surface 922 of the substrate 92 a low force is sufficient to cause breakage of the adhesive connection at the support locations, without breaking or otherwise damaging the substrate.

Prior to or simultaneous with raising the lift pins 962a, 962b, the adhesive material 96 may be at least partly exposed to electromagnetic radiation, thermal energy, and/or a chemical substance reducing its adhesive strength and/or softening the adhesive material. For example the adhesive material can be exposed to radiation from one or more electromagnetic radiation sources, in an analogous manner as illustrated in FIG. 6D. Alternatively, a chemical substance, such as a dissolvent, may be introduced into the space 93 between the substrate 92 and the support 94.

When the adhesive material 96 breaks residues 96a, 96b of adhesive material may be left on the substrate 92 and/or on the support 94, as illustrated in FIGS. 9B and 9C. Such residues 96a, 96b are typically removed by a chemical process, using a solvent or cleaning substance, and/or by a mechanical process.

Figure 10:
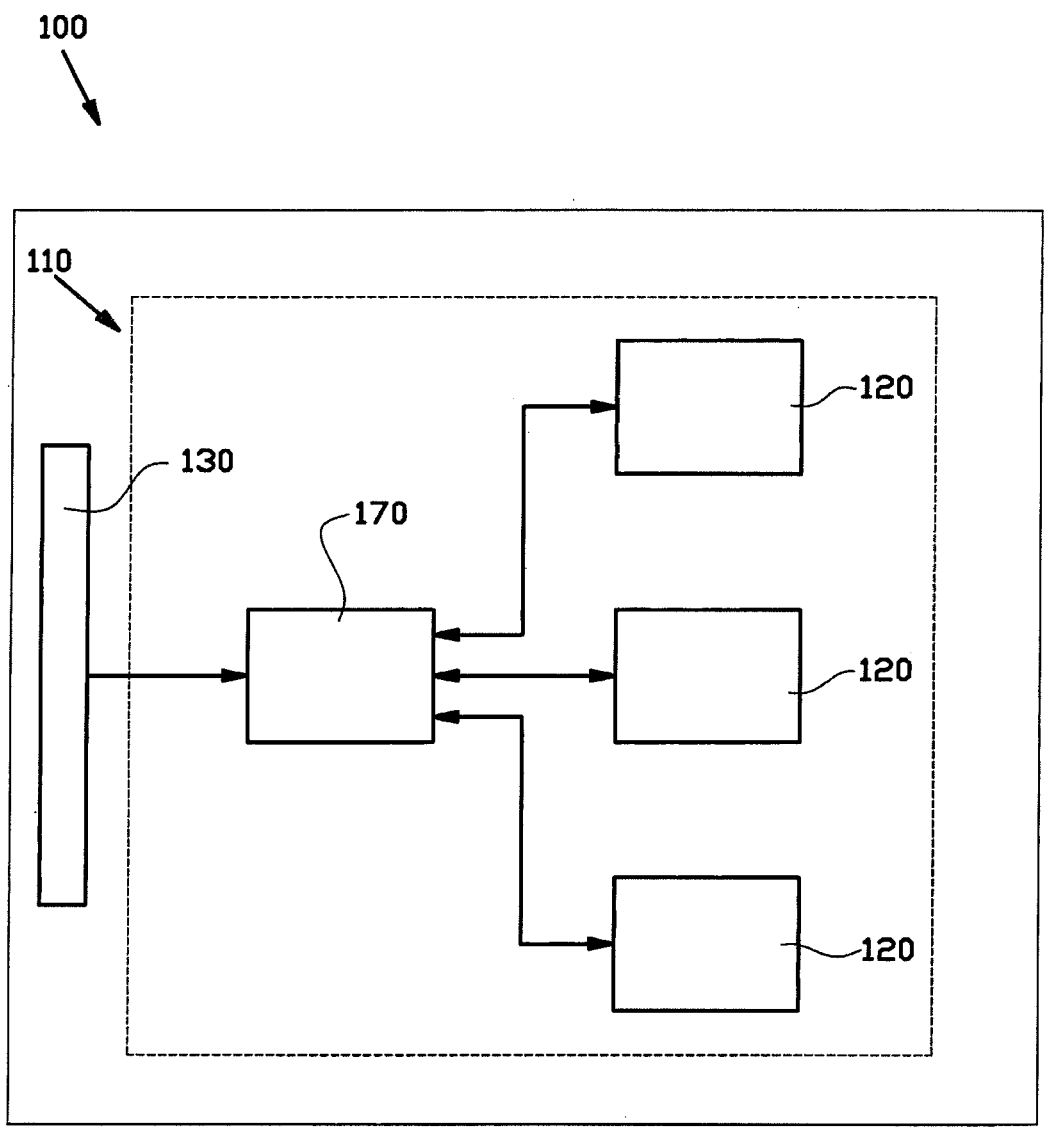
FIG. 10 schematically illustrates a manufacturing plant provided with an arrangement for clamping according to embodiments of the present disclosure.

FIG. 10 schematically illustrates a manufacturing plant 100, for example a semiconductor fab, provided with a lithography system 110. The lithography system comprises a clamping station 170 and at least one exposure apparatus 120. In the given example, for illustration three exposure apparatus 120 are shown.

Although only one lithography system 110 is shown, the manufacturing plant 100 may comprise multiple such lithography systems.

The clamping station 170 receives or is provided with substrates and may encompass an arrangement for clamping, such as a clamping arrangement described with reference to FIG. 7, or another arrangement or system for clamping a substrate to a support. In some embodiments, it is configured for clamping a substrate to a support according to methods as described herein, for example a method as described with reference to FIG. 6A to 6D.

The clamping station 170 can be arranged to serve one or more exposure apparatus 120 with clamps. After the substrate has been processed in the exposure apparatus 120, that is, exposed to radiation, e.g. such as to form a pattern in a resist layer on the substrate surface, the clamp is removed from the exposure apparatus. The clamp can be transferred back to the clamping station 170, or to a separate unclamping station (not illustrated), for separating the substrate from the support. The substrate can be separated from the support by the method for unclamping described with reference to FIGS. 9A to 9C.

Transport and/or other displacement of substrates within the manufacturing plant 1, and hence also within the lithography system 110, may, at least to certain extent, be performed by robots and/or other automated processes.

The substrates to be processed may be transported to the clamping station 170 by a substrate distribution system 130. After processing, the substrates may be transferred away from the lithography system 110 by the substrate distribution system 130, or by a further substrate distribution system.

Additionally, the manufacturing plant 100 may comprise further units or stations for substrate processing, as is known in the field of semiconductor technology. For example, etch stations, development stations, dopant implementation stations, etc., can be provided.

After having been exposed to patterning radiation in a lithography apparatus 120, and preferably subsequently unclamped, the substrate may be transported to one or more such further stations, for example by a substrate distribution system.

The systems, arrangements and methods of the present disclosure have been described by reference to certain embodiments discussed above. These embodiments are susceptible to various modifications and alternative forms without departing from the scope of protection defined in the appended claims.

The embodiments may further be described using the following clauses.

C1. Method for clamping a rigid substrate to a support, the method comprising:
providing a support comprising a first surface defining a plane;
applying adhesive material on at least portions of said first surface;
placing the substrate onto the adhesive material, such that said adhesive material forms a plurality of support locations supporting said substrate; and
curing said adhesive material.

C2. Method according to clause 1, wherein said curing comprises exposing said adhesive material to electromagnetic radiation, thermal energy and/or a chemical substance.

C3. Method according to clause 2, comprising transmitting said electromagnetic radiation and/or said thermal energy through said support.

C4. Method according to any one of the preceding clauses, wherein said curing results in said adhesive material being substantially incompressible under a weight of said substrate.

C5. Method according to any one of the preceding clauses, comprising providing said adhesive material with spacers.

C6. Method according to any one of the preceding clauses, comprising applying said adhesive material as a plurality of areas of adhesive material.

C7. Method according to clause 6, comprising applying said areas of adhesive material to be isolated from one another.

C8. Method according to any one of clauses 1 to 6, comprising applying said adhesive material in a manner interconnecting said plurality of support locations.

C9. Method according to any one of clauses 6 to 8, comprising controlling the volume of adhesive material applied at each area of adhesive.

C10. Method according to any one of the preceding clauses, wherein said support locations correspond to less than 1% of a surface of said substrate facing said support.

C11. Method according to any one of the preceding clauses, comprising arranging said support locations substantially along one or more concentric circles, centered at a central point under said substrate.

C12. Method according to any one of the preceding clauses, wherein said curing takes place at least partly during application of a force to the substrate directed towards said support.

C13. Method according to clause 12, comprising applying said force by providing a pressure difference over said substrate.

C14. Method according to clause 13, comprising providing said pressure difference by reducing a pressure in a space between said substrate and said support by at least partly evacuating said space.

C15. Method of unclamping a rigid substrate which is clamped to a support via adhesive material forming a plurality of support locations, said substrate extending in a substrate plane, the method comprising:
  applying a force at one or more locations along a periphery of a surface of the substrate facing said support, said force applied with a direction component in a direction perpendicular to said substrate plane; and
  subsequently lifting the substrate from the support.

C16. Method of unclamping according to clause 15, comprising applying said force subsequently at multiple locations along said periphery, wherein the multiple locations are substantially uniformly distributed along said periphery.

C17. Method of unclamping according to clause 15 or 16, comprising exposing at least a part of said adhesive material to electromagnetic radiation prior to applying said force.

C18. Method of unclamping according to any one of clauses 15 to 17, comprising removing residues of adhesive material using a solvent and/or a mechanical treatment.

C19. Clamping arrangement for clamping a rigid substrate to a support, the clamping arrangement comprising:
  a support comprising a first surface, for supporting said substrate via adhesive material, said first surface defining a plane; and
  an arrangement for exposing the adhesive material to electromagnetic radiation, thermal energy, and/or a chemical substance.

C20. Clamping arrangement according to clause 19, comprising one or more sources of electromagnetic radiation and/or thermal energy.

C21. Clamping arrangement according to clause 20, wherein said sources of electromagnetic radiation and/or thermal energy comprise a plurality of individually or group wise controllable sources.

C22. Clamping arrangement according to any one of clauses 19 to 21, wherein said support is at least partly transparent to said electromagnetic radiation and/or thermal energy.

C23. Clamping arrangement according to any one of clauses 19 to 22, wherein said first surface comprises a plurality of islands, each island having an island surface, said island surfaces together defining said plane.

C24. Clamping arrangement according to clause 23, wherein said plurality of islands is provided by a plurality of protrusions from said support.

C25. Clamping arrangement according to clause 23 or 24, wherein said islands are at least partly transparent to said electromagnetic radiation and/or thermal energy.

C26. Clamping arrangement according to any one of clauses 19 to 25, wherein said islands are arranged substantially along one or more concentric circles centered at a central point.

C27. Clamping arrangement according to any one of clauses 23 to 26, wherein a total area of said island surfaces is smaller than a total surface area to be located underneath said substrate when said substrate is positioned on said support.

C28. Clamping arrangement according to any one of clauses 23 to 27, wherein a total area of said island surfaces represents less than 1% of a total surface area located underneath said substrate when said substrate is positioned on said support.

C29. Clamping arrangement according to any one of clauses 19 to 28, further comprising an arrangement for applying a force to the substrate in a direction of said support when said substrate is supported by said first surface.

C30. Clamping arrangement according to clause 29, wherein said arrangement for applying a force comprises an arrangement for reducing a pressure in a space between said substrate and said support.

C31. Clamp formed by a substrate clamped to a support according to the method of any one of clauses 1 to 15.

C32. Lithography system comprising a clamping arrangement according to any one of clauses 19 to 30 and/or a system for clamping a substrate to a support according to the method of any one of clauses 1 to 15.

C33. Lithography system according to clause 32, further comprising one or more exposure apparatuses for exposing said clamped substrate to radiation.

C34. Manufacturing plant provided with a clamping arrangement according to any one of clauses 19 to 30 and/or a system for clamping a substrate to a support by the method according to any one of clauses 1 to 15 and/or a lithography system according to clause 32 or 33.

What is claimed is:

1. A method for clamping a substrate to a support, the method comprising:
   providing the support comprising a first surface defining a plane;
   applying adhesive material on portions of the first surface;
   placing the substrate onto the adhesive material, such that the adhesive material forms a plurality of support locations supporting the substrate that are at least partially separated from one another and wherein voids are provided between the substrate and the support; and
   curing the adhesive material;
   wherein the curing takes place at least partly during application of a force to the substrate, directed towards the support, and
   wherein the curing results in the adhesive material undergoing chemical and/or physical changes such as to increase rigidity of the adhesive material.

2. The method according to claim 1, wherein the curing comprises exposing the adhesive material to electromagnetic radiation, thermal energy, and/or a chemical substance.

3. The method according to claim 1, wherein the curing results in the adhesive material being substantially incompressible under a weight of the substrate.

4. The method according to claim 1, further comprising providing the adhesive material with spacers.

5. The method according to claim 1, further comprising applying the adhesive material as a plurality of areas of adhesive material.

6. The method according to claim 1, further comprising applying the adhesive material in a manner interconnecting the plurality of support locations.

7. The method according to claim 5, further comprising controlling volume of adhesive material applied at each area of adhesive material.

8. The method according to claim 1, wherein the plurality of support locations correspond to less than 1% of a surface of the substrate facing the support.

9. The method according to claim 1, further comprising arranging the plurality of support locations substantially along one or more concentric circles, centered at a central point under the substrate.

10. The method according to claim 1, further comprising applying the force by providing a pressure difference over the substrate.

11. The method according to claim 10, further comprising providing the pressure difference by reducing a pressure in a space between the substrate and the support by at least partly evacuating the space.

12. A method of unclamping a substrate which is clamped to a support via adhesive material that has been cured such that the adhesive material has undergone chemical and/or physical changes to increase rigidity of the adhesive material forming a plurality of support locations, the substrate extending in a substrate plane, the method comprising:
   applying a force at one or more locations along a periphery of a surface of the substrate facing the support, the force applied with a direction component in a direction perpendicular to the substrate plane;
   subsequently lifting the substrate from the support; and
   applying the force subsequently at multiple locations one after the other along the periphery, wherein the multiple locations are substantially uniformly distributed along the periphery.

13. A clamping arrangement for clamping a substrate to a support, the clamping arrangement comprising:
   the support comprising a first surface, for supporting the substrate via adhesive material at a plurality of regions that are at least partially separated from one another and wherein voids are provided between the substrate and the support, the first surface defining a plane;
   an arrangement for exposing the adhesive material to electromagnetic radiation, thermal energy, and/or a chemical substance;
   an arrangement for applying a force to the substrate in a direction of the support when the substrate is supported by the first surface; and
   an arrangement for reducing a pressure in a space between the substrate and the support,
   wherein the clamping arrangement is configured to cure the adhesive material so as to undergo chemical and/or physical changes such as to increase rigidity of the adhesive material.

14. The clamping arrangement according to claim 13, further comprising one or more sources of electromagnetic radiation and/or thermal energy.

15. The clamping arrangement according to claim 14, wherein the sources of electromagnetic radiation and/or thermal energy comprise a plurality of individually or group wise controllable sources.

16. The clamping arrangement according to claim 13, wherein the support is at least partly transparent to the electromagnetic radiation and/or thermal energy.

17. The clamping arrangement according claim 13, wherein the first surface comprises a plurality of islands, each island having an island surface, the island surfaces together defining the plane.

18. The clamping arrangement according to claim 17, wherein the plurality of islands is provided by a plurality of protrusions from the support.

19. A lithography system comprising a clamping arrangement according to claim 13.

20. The lithography system according to claim 19, further comprising one or more exposure apparatuses for exposing the clamped substrate to radiation.

* * * * *